(12) United States Patent
Chew et al.

(10) Patent No.: US 8,791,583 B2
(45) Date of Patent: Jul. 29, 2014

(54) APPARATUS FOR MOLDING A SEMICONDUCTOR WAFER AND PROCESS THEREFOR

(75) Inventors: Hwee Seng Jimmy Chew, Singapore (SG); Dingwei Xia, Singapore (SG)

(73) Assignee: Advanced Systems Automation Ltd., Singapore (SG)

( * ) Notice: Subject to any disclaimer, the term of this patent is extended or adjusted under 35 U.S.C. 154(b) by 2244 days.

(21) Appl. No.: 10/491,687

(22) PCT Filed: Oct. 4, 2002

(86) PCT No.: PCT/SG02/00229
§ 371 (c)(1), (2), (4) Date: Oct. 29, 2004

(87) PCT Pub. No.: WO03/044850
PCT Pub. Date: May 30, 2003

(65) Prior Publication Data
US 2005/0064065 A1 Mar. 24, 2005

(30) Foreign Application Priority Data
Oct. 5, 2001 (SG) .................... 200106164-7

(51) Int. Cl.
*H01L 23/29* (2006.01)

(52) U.S. Cl.
USPC ............ 257/790; 257/791; 438/126; 438/127

(58) Field of Classification Search
USPC ........... 257/787, 788, 790, 796, 678, 778, 91, 257/792, 793; 438/106, 127, 126, 108, 124, 438/125
See application file for complete search history.

(56) References Cited

U.S. PATENT DOCUMENTS 6,478,562 B1 * 11/2002 Miyajima .................. 425/89

* cited by examiner

*Primary Examiner* — Thanh Y Tran
(74) *Attorney, Agent, or Firm* — Jackson Walker L.L.P.; Christopher J. Rourk

(57) ABSTRACT

Mold pieces (105 and 110) for molding a layer of mold compound on the interconnect side of a bumped semiconductor wafer (118) include a primary cavity (117) and secondary cavities (120) into which excess mold compound from the primary cavity (117) flows. The secondary cavities (120) include a plunger (130) that asserts a predetermined back-pressure that is equal to a desired mold compound pressure on the mold compound during molding. As most of the excess mold compound in the primary cavity (117) is forced to flow into the secondary cavities (120), this advantageously leaves a relatively thin layer of mold compound on the semiconductor wafer (118), which can then be removed, for example by grinding in a relatively short time. Mold piece (105) further comprises a movable cavity bar (115) that can be moved away from mold piece (105) after molding and be cooled to detach the molded substrate that adheres to the cavity bar.

26 Claims, 8 Drawing Sheets

APPARATUS FOR MOLDING A SEMICONDUCTOR WAFER AND PROCESS THEREFOR

FIELD OF THE INVENTION

The present invention relates to encapsulating a semiconductor wafer, and more particularly to encapsulating a bumped semiconductor wafer in mold compound.

BACKGROUND OF THE INVENTION

As is known, a chip scale package (CSP) is a semiconductor package that houses a semiconductor die, where the external dimensions of the semiconductor package approximates the size of the semiconductor die. Some chip scale packages (CSPs) house a bumped semiconductor die, where interconnect terminals (interconnects) are formed on pads on the die. The process of forming the interconnects is often referred to as bumping. Typically, at the wafer level, the interconnects are formed from solder, such as, eutectic or high lead solder, on the pads of the constituent dies of the wafer. Alternatively, the interconnects can be made of metal such as gold, silver, tin and copper. In addition, the metal interconnects may also have a solder cap.

One method of forming CSPs is by molding the interconnect side of a bumped semiconductor wafer in mold compound. A bumped semiconductor wafer is placed on a contoured molding surface of a lower mold piece, with the interconnect side of the semiconductor wafer facing upwards i.e. with the interconnects extending upwardly. A predetermined amount of mold compound is then disposed on the interconnect side of the wafer. The lower mold piece and upper mold piece are then brought together, with the contoured molding surface and a flat molding surface on the upper mold piece forming a cavity with the substrate and the predetermined amount of mold compound enclosed in the cavity. As the lower mold piece and an upper mold piece are forced together under an imposed elevated temperature, the predetermined amount of mold compound is compressed to produce a predetermined pressure on the mold compound in the cavity.

The mold compound melts and the molten mold compound under the resultant mold compound pressure, flows across the interconnect side of the semiconductor wafer, and between the interconnects, to form a layer of mold compound on the interconnect side of the semiconductor wafer. After the mold compound has set, the upper and lower mold pieces are separated. Typically, the molded interconnect side of the semiconductor wafer adheres to the upper mold piece due to the binding force between the solidified mold compound and the flat molding surface of the upper mold piece.

Ideally, the predetermined amount of mold compound is selected such that there is a sufficient amount of mold compound to form a layer having a thickness that leaves the free ends of the interconnects exposed. However, when the predetermined amount of mold compound is used, a predetermined mold compound pressure may not be attained during compression between the mold pieces. Hence, this approach risks the formation of voids in the layer of molded compound on the semiconductor wafer.

Typically, to avoid the formation of voids, an excess amount of mold compound is employed to ensure the predetermined mold compound pressure is attained in the cavity during compression between the mold pieces. Consequently, the free ends of the interconnects are covered by the excess portion of the layer of mold compound that is formed. The excess portion is then removed by grinding it away to expose the free ends of the interconnects. However, due to the relatively large amount of mold compound that has to be removed, the grinding process is slow, adversely affecting throughput of CSP production. For example, the excess portion can be 20 microns ($10^{-6}$ meters) thick, and the use of grinding, lapping, laser and/or plasma etching, or a combination of these, can take up to 30 minutes to remove the excess portion of mold compound.

Another disadvantage of this process, prior to grinding, is the difficulty in removing the molded semiconductor wafer from the upper mold piece without damaging and/or adversely affecting the constituent dies of the semiconductor wafer.

European patent application no. EP1035572 by Towa Corporation of Japan teaches a method of encapsulating a semiconductor wafer with mold compound that employs film disposed across the flat molding surface of the upper mold piece, prior to molding. Here, a semiconductor wafer having interconnects extending from the pads thereon, is placed in a cavity of a lower mold piece, with the interconnects extending upwardly, as before. A predetermined amount of mold compound is then disposed on the extending interconnects, and the film is disposed across the flat molding surface of the upper mold piece. The upper and lower mold pieces are then brought together under an imposed elevated temperature, compressing the predetermined amount of mold compound and the substrate in the cavity.

The molten mold compound flows across the surface of the interconnect side of the semiconductor wafer and between the interconnects to form a layer of mold compound on the semiconductor die. During compression, the free ends of the interconnects abut the film on the upper mold piece, where the film is intended to prevent the free ends of the interconnects from being covered with mold compound, thus avoiding the need for a subsequent grinding step. After the mold compound has set, the upper and lower mold pieces are separated and the film and molded semiconductor wafer adheres to the upper mold piece. Here the film allows the molded semiconductor wafer to be removed from the upper mold piece by pulling on it. Then, in a subsequent peeling step, the film is removed from the molded semiconductor wafer and discarded.

As mentioned earlier, the film is used to prevent the free ends of the interconnects from being covered in mold compound to avoid the need for grinding. In addition the film also allows the molded semiconductor wafer to be removed from the upper mold piece. However, a disadvantage of using film is that the film is discarded after each mold shot. Hence, the cost of using film is relatively high. Another disadvantage of using film is the need for the additional peeling step to remove the film from the molded semiconductor wafer. The peeling step has its cost, handling and throughput concerns. Yet another disadvantage of using film is that some of the mold compound can become trapped between the free ends of the interconnects and the film. Consequently, the additional step of removing the mold compound using the processes, such as grinding and etching, as mentioned earlier, may still need to be performed after the peeling step. A further disadvantage of using film is that air may become trapped between the film and the wafer, and this can lead to the formation of voids in the molded wafer, which can adversely affect the reliability of the constituent packaged semiconductor dies.

An alternative to using film to aid in the removal of the molded semiconductor wafer from the upper mold piece is to coat the flat molding surface of the upper mold piece with non-stick material such as Teflon®. While the layer of non-stick material assist in the removal of the molded semiconductor wafer from the upper mold piece, it does not ensure that the free ends of the interconnects are not covered by mold compound nor does the use of non-stick material have any effect on the amount of excess mold compound that has to be removed. Hence, the need for the subsequent steps of grinding or etching and the like, as described earlier. In addition, the layer of non-stick material has a relatively short useful life, and provisions will need to be made to replace the layer of non-stick material regularly.

BRIEF SUMMARY OF THE INVENTION

The present invention seeks to provide an apparatus for molding a semiconductor wafer and process therefor which overcomes, or at least reduces, the abovementioned problems of the prior art.

Accordingly, in one aspect, the present invention provides an apparatus for molding a layer of mold compound on at least one surface of a substrate, wherein the at least one surface has interconnects extending therefrom, the apparatus comprising:

a plurality of mold pieces having an open position and a molding position, where in the molding position the plurality of mold pieces form a primary cavity for disposing the substrate therein, for disposing a predetermined amount of mold compound on the at least one surface of the substrate and for molding the layer of mold compound on the at least one surface of the substrate, and the plurality of mold pieces form a secondary cavity coupled to the primary cavity, the secondary cavity for receiving excess mold compound from the primary cavity, and the secondary cavity having a pressure asserting element for asserting a predetermined pressure on the mold compound.

In another aspect, the present invention provides a method for molding a layer of mold compound on at least one surface of a substrate, wherein the at least one surface has interconnects extending therefrom, the method comprising the steps of:

a) moving a plurality of mold pieces to an open position;
b) disposing the substrate on at least one of the plurality of mold pieces;
c) disposing a predetermined amount of mold compound on the at least one surface of the substrate;
d) moving the plurality of mold pieces from the open position to a molding position to form a primary cavity, a secondary cavity and channel therebetween, with the substrate and the predetermined amount of mold compound in the primary cavity;
e) compressing the predetermined amount of mold compound and the substrate in the primary cavity;
f) channeling excess mold compound from the primary cavity to the secondary cavity via the channel;
g) asserting a predetermined pressure on the excess mold compound in the secondary cavity;
h) allowing the mold compound to set under the imposed predetermined pressure;
i) moving the plurality of mold pieces from the molding position to the open position; and
j) removing the molded substrate from the primary cavity.

In yet another aspect the present invention provides a molding apparatus comprising:

a plurality of mold pieces for forming a mold cavity, each of the plurality of mold pieces for providing at least part of a molding surface of the mold cavity, wherein during molding the plurality of mold pieces come together to form the mold cavity and to form a molded unit in the mold cavity, and wherein after molding at least some of the plurality of mold pieces move apart;

at least one of the plurality of mold pieces having a first position relative to the rest of the plurality of mold pieces during molding, and having a second position relative to the rest of the plurality of mold pieces after molding, wherein at the second position the molded unit adheres to the at least part of the molding surface of the at least one of the plurality of mold pieces;

at least one heating system for heating one or more of the plurality of mold pieces during molding; and at least one cooling system for cooling the at least one of the plurality of mold pieces after molding.

In still another aspect the present invention provides a method for molding a unit in a cavity formed by a plurality of mold pieces, wherein the molded unit adheres to one of the plurality of mold pieces after molding, the method comprising the steps of:

a) disposing units to be molded between the plurality of mold pieces;
b) assembling the plurality of mold pieces to form the cavity with the units to be molded located in the cavity;
c) filling the cavity with mold compound while imposing heat on at least some of the plurality of mold pieces;
d) separating the plurality of mold pieces with the molded units adhering to one of the plurality of mold pieces; and
e) cooling the at least one of the plurality of mold pieces to detach the molded unit from the one of the plurality of mold pieces.

In yet still another aspect the present invention provides a method for removing a molded unit that adheres to a molding surface of a mold piece after molding, the method comprising the step of cooling the mold piece.

BRIEF DESCRIPTION OF THE DRAWINGS

An embodiment of the present invention will now be fully described, by way of example, with reference to the drawings of which.

DETAIL DESCRIPTION OF THE DRAWINGS

Mold pieces for molding a layer of mold compound on the interconnect side of a bumped semiconductor wafer include a primary cavity, and a secondary cavity, into which excess mold compound from the primary cavity flows via an channel. The secondary cavity includes a plunger that asserts a predetermined backpressure on the mold compound that is equal to a desired mold compound pressure. In this way, a significant portion of excess mold compound is forced into the secondary cavity, and the mold compound is under the desired mold compound pressure. Most of the excess mold compound in the primary cavity flows into the secondary cavity, advantageously leaving a relatively thin layer of excess mold compound on the semiconductor wafer. The thin layer of mold compound is then advantageously removed in a relatively short time, for example by grinding or etching. By design, when the lower and upper mold pieces are separated, the molded semiconductor wafer adheres to the upper mold piece and the solidified mold compound in the secondary cavity adheres thereto. Consequently, the solidified mold compound in the channel fractures and breaks, the separating the two.

The upper mold piece includes a substantially planar and movable cavity bar, and the molded semiconductor wafer adheres to the cavity bar. After the mold pieces are separated, the cavity bar is removed from the upper mold piece and cooled. While cooling down, the molding compound of the molded semiconductor wafer shrinks. The shrinkage of the molded wafer is much more than contraction of the cavity bar during cool down, which reduces the binding between the molded semiconductor wafer and the cavity bar, resulting in the molded semiconductor wafer detaching from the cavity bar.

Hence, the molded semiconductor wafer is advantageously removed from the upper mold piece without the use and consequent expense of film, and without subjecting the molded semiconductor wafer to the risk of damage by mechanical removal.

Figure 1:
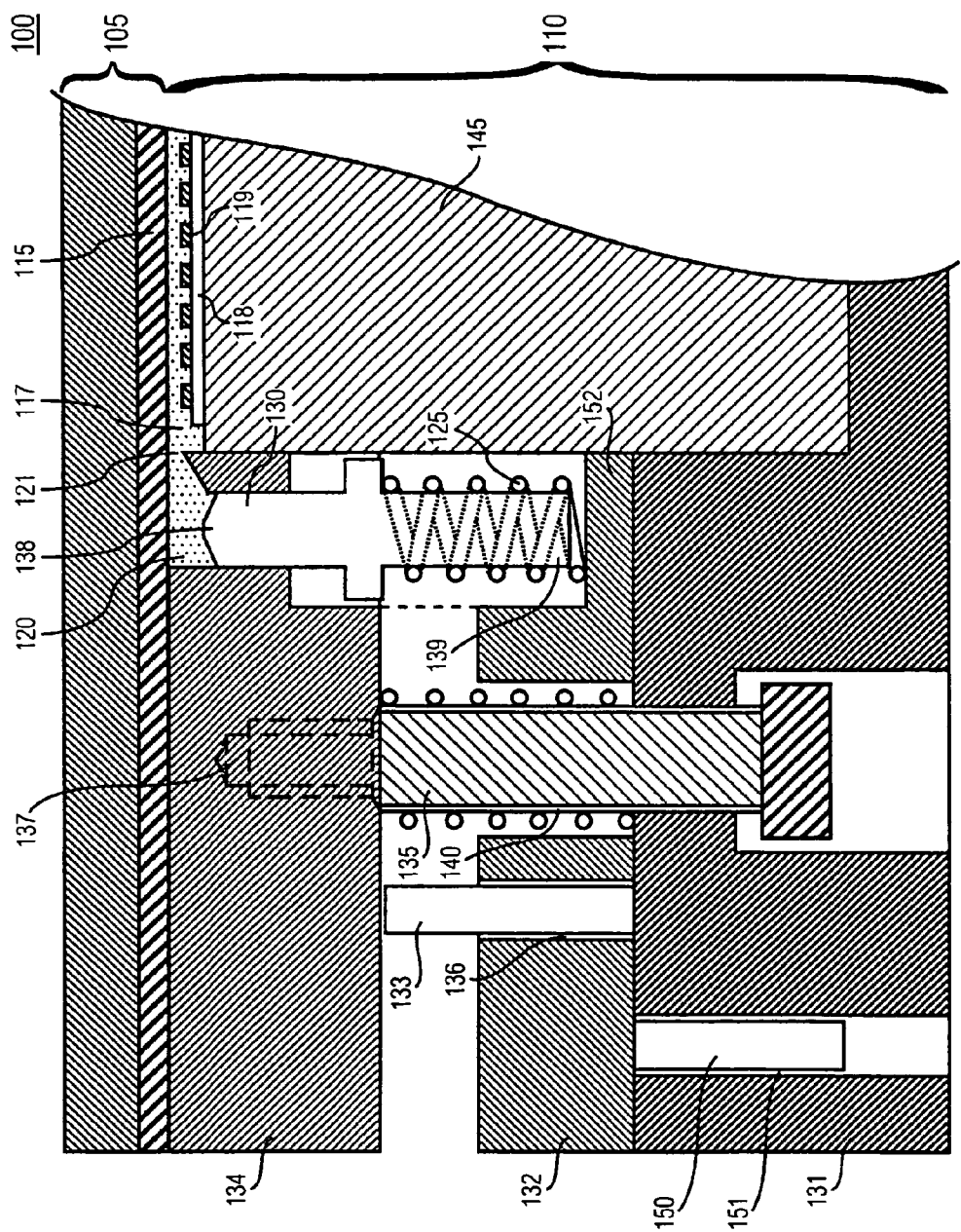
FIG. 1 shows a side sectional view of a molding apparatus in accordance with the present invention.

FIG. 1 shows a portion of a molding apparatus 100 comprising an upper mold piece 105 and a lower mold piece 110 in a molding position. As is known by one skilled in the art, the upper mold piece 105 is mounted to an upper portion of a press (not shown), and the lower mold piece 110 is mounted to a lower portion of a press (not shown). In a conventional molding press, the upper portion is not movable and the lower portion moves in a vertical direction between an upper molding position and a lower open position. Consequently, the lower mold piece 110 is moved vertically between the lower open position and the raised molding position, which is shown.

The upper mold piece 105 includes a movable cavity bar 115 that slides horizontally when the upper mold piece 105 is spaced apart from the lower mold piece 110 i.e. when the mold pieces 105 and 110 are in the open position. The upper mold piece 105 is made of steel such as P20, as is known in the art, and the movable cavity bar is made of tooling steel such as 440C or ASP23, as is known in the art. The cavity bar 115 is shaped to slide in a correspondingly shaped recess in the upper mold piece 105. Hence, the cavity bar 115 slides horizontally on the upper mold piece 105.

The lower mold piece 110 has a cavity 117 with a molding surface, and within the cavity 117 a semiconductor wafer 118 having interconnects 119 is disposed for molding. The lower mold piece 110 includes several secondary cavities, although here only one secondary cavity 120 is shown for illustrative purposes. The secondary cavity 120 is coupled to the primary cavity 117 via a gate 121, which provides a channel for molten mold compound to flow from the primary cavity 117 to the secondary cavity 120 during molding. A selected spring 125 acts with a predetermined force on a plunger 130. The plunger 130 provides a movable surface of the secondary cavity 130 by way of its upper portion 138, and this movable surface exerts a predetermined pressure, also referred to as backpressure, on the mold compound in the secondary cavity 120, and hence, on the mold compound in the primary cavity 117.

Thus, by employing the spring 125 that exerts a corresponding force when compressed, a predetermined mold compound pressure can advantageously be imposed and maintained on the mold compound in the primary cavity 117 by the plunger 130 during molding. The plunger may be 3-5 millimeters (mm) in diameter, and will be described later. There are a number of plungers and associated secondary cavities arranged around the primary cavity 117.

The spring 125 provides a relatively cheap and convenient way of exerting the required force, however it will be appreciated that pneumatic and hydraulic systems with associated actuators may be employed in the secondary cavity 120 to exert the required force on the plunger 130.

The lower mold piece 110 includes a bottom mold base 131, an ejector plate 132, a stopper shaft 133, a lower cavity plate 134, and a lower cavity core 145. The lower cavity core 145 provides a lower molding surface on which substrate 118 is disposed, and the lower cavity core rests on a portion of the bottom mold base 131. Guides 135 extend through a sleeve 140 in the bottom mold base 131 and the ejector plate 132, and into the lower cavity plate 134 where it is anchored. The free-end of the guide 135 has a nut secured thereon. The guides 135 slide in the sleeve 140 to maintain vertical alignment between the upper and lower mold pieces 105 and 110 when the lower mold piece 110 moves between the open position and the molding position.

The bottom mold base 131 supports the stopper shaft 133, and the height of the stopper shaft 133 determines the thickness of the excess mold compound on the free ends of the interconnects 119. Stopper shafts having a variety of heights are employed to set the desired thickness which will depend on the thickness of the semiconductor wafer 118 and the height of the interconnects 119, and the selected stopper shaft having a desired height is inserted in a stopper opening 136 in the stopper plate 132. Typically, with each batch of wafers to be molded, a particular stopper shaft having a selected height will be employed.

The lower cavity plate 134 receives the end 137 of the guide 135, which may be spring loaded, with the lower cavity plate being vertically movable. In addition, the lower cavity plate 134 also forms the secondary cavity 120 in association with the upper portion 138 of the plunger 130. An extended portion 152 of the ejector plate 132 forms a base for the spring 125, and when the ejector plate 132 is raised the extended portion 152 abuts the lower portion 139 of the plunger 130, and raises the plunger 130 relative to the lower cavity plate 134.

The lower mold piece 110 further includes an ejector shaft 150, which extends from the lower surface of the ejector plate 132, through an opening 151 in the bottom mold base plate 131. The ejector shaft 150 can have a diameter of approximately 10 mm, and is aligned with an actuator 160 (shown in FIG. 4F) which is part of an ejector system, as will be known to one skilled in the art. When the ejector system (not shown) in the lower portion of the press is activated, the actuator 160 moves upwards abutting the ejector shaft 150, which raises the ejector plate 132 against the force of the spring 125 and the weight of the ejector plate 132. The raised extended portion 152 of the ejector plate 132 abuts the lower portion 139 of the plunger 130 and raises the plunger 130 relative to the lower cavity plate 134. The upward force on the plunger 130 causes the upper portion 138 of the plunger 130 to eject mold compound solidified in the secondary cavity 120, as will be described in more detail later.

Figure 2:
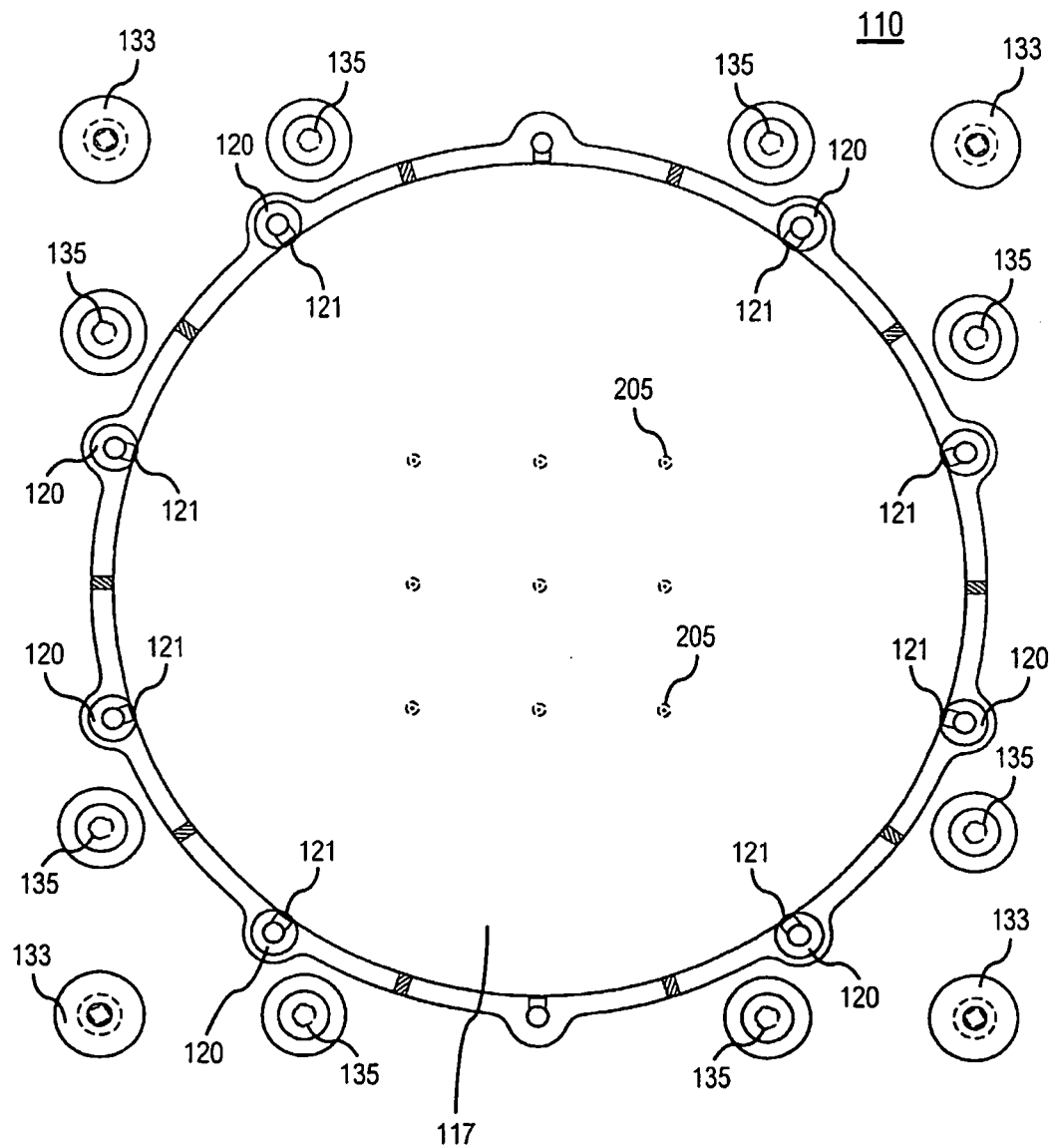
FIG. 2 shows a top view of a lower piece of the molding apparatus in FIG. 1.
Figure 3:
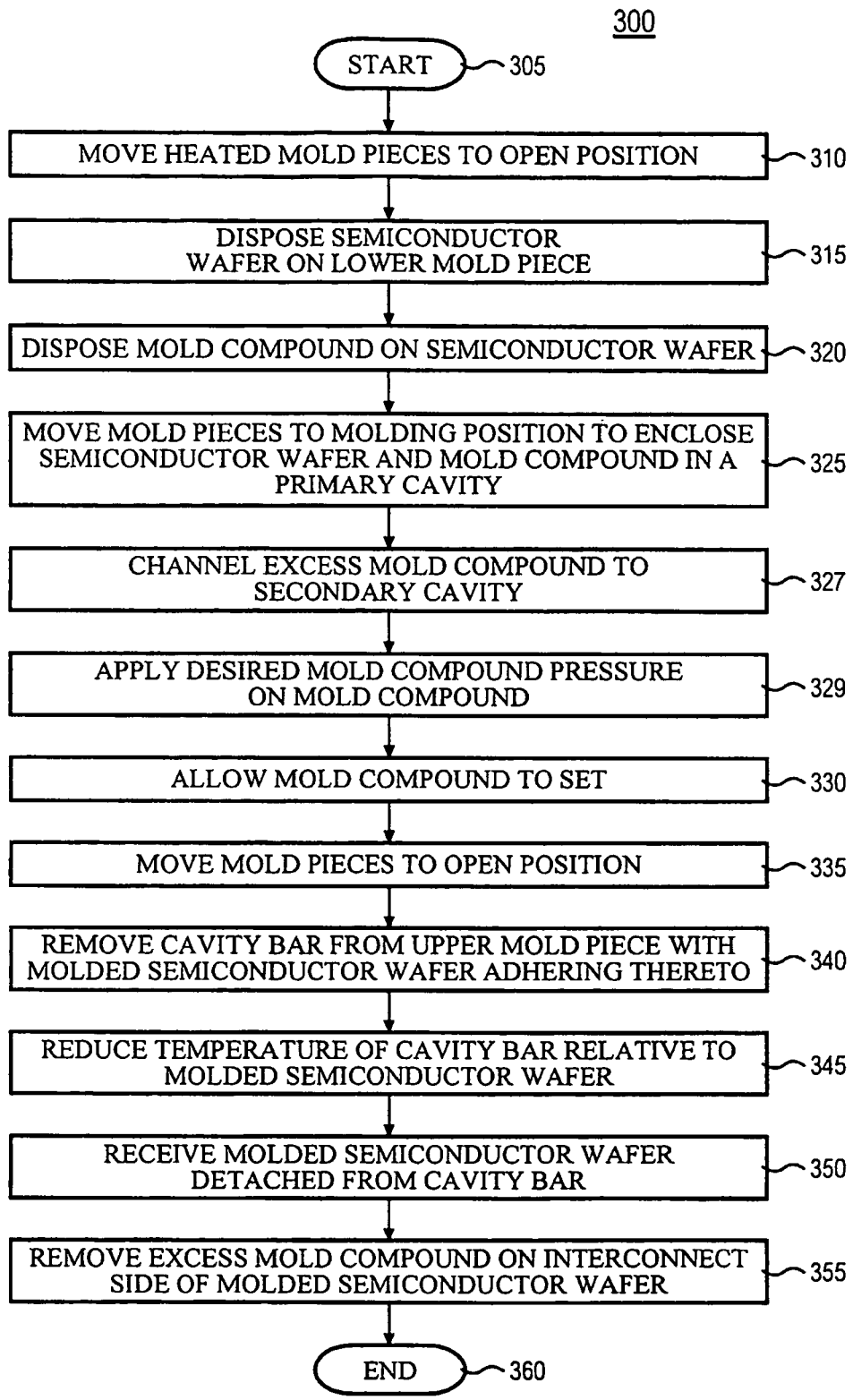
FIG. 3 shows a flowchart of a molding process using the molding apparatus in FIG. 1.

FIG. 2 shows a top view of the lower mold piece 110 where a number of the secondary cavities 120 are located around the primary cavity 117, with each of the secondary cavities 120 coupled to the primary cavity 117 by gates 121, as described earlier. Optionally, vacuum openings 205 in the primary cavity 117 may be used to hold the semiconductor wafer 118 in the primary cavity 117 during molding and subsequently released after molding. In addition, the guides 135 and their respective sleeves 140 are shown around the primary cavity 117.

Figure 4A:
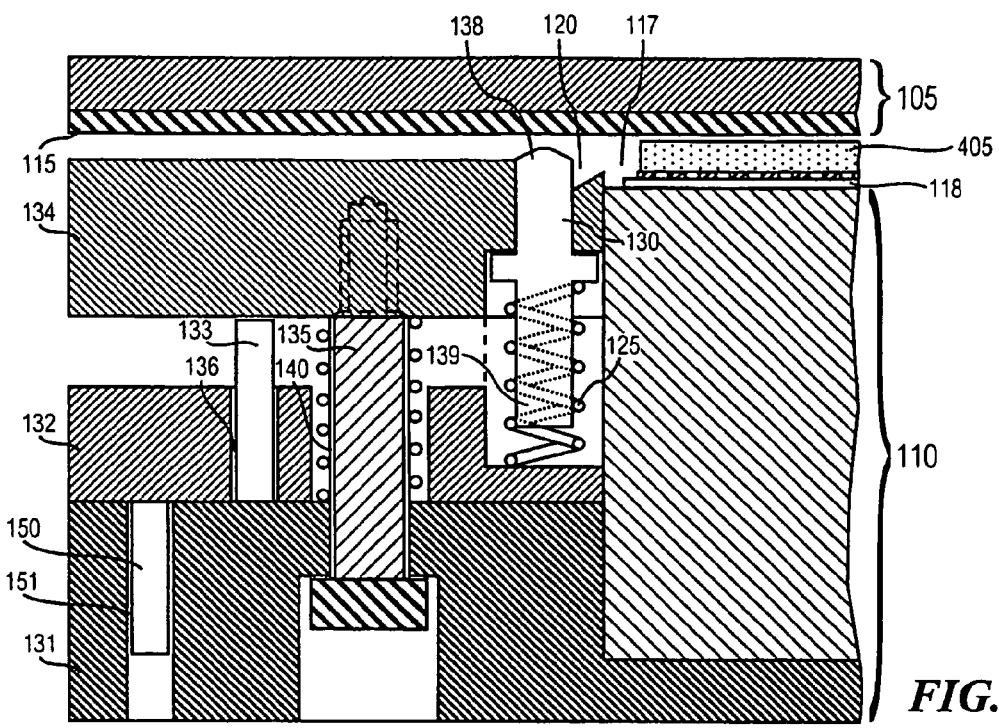
FIGS. 4A-G shows various positions of the molding apparatus in accordance with the process in FIG. 3.

With reference to FIG. 3 and FIGS. 4A-F, the molding process 300 starts 305 with moving 310 the upper and lower mold pieces 105 and 110 to the open position as shown in FIG. 4A. Note that the plunger 130 under the force of the spring 125 extends upwards to the maximum allowable limit set by the contour of the lower cavity plate 134. Typically, the mold pieces 105 and 110 incorporate heating means, such as electric heating elements (not shown) that maintain the mold pieces 105 and 110 at a predetermined elevated temperature in preparation for molding. The bumped semiconductor wafer 118 is then disposed 315 on the lower mold piece 110 that forms the base of the primary cavity 117, on which the wafer 118 may be optionally secured with a vacuum applied to the semiconductor wafer 118 via openings 205.

Next, a pellet 405 of mold compound is disposed 320 on the semiconductor wafer 118, as also shown in FIG. 4A. Although, a pellet is shown here, it will be appreciated by one skilled in the art that mold compound in liquid or powder form may also be used and an appropriate dispense mechanism employed. The amount of mold compound is selected to result in a volume of mold compound which: fills the primary cavity 117; all the secondary cavities 120; and include sufficient additional volume to force the plunger 130 against the action of the spring 125. This ensures that the predetermined mold compound pressure i.e. the pressure on the mold compound, as a result of the spring 125 acting on the plunger 130, is asserted on the mold compound in the primary cavity 117.

Figure 4B:
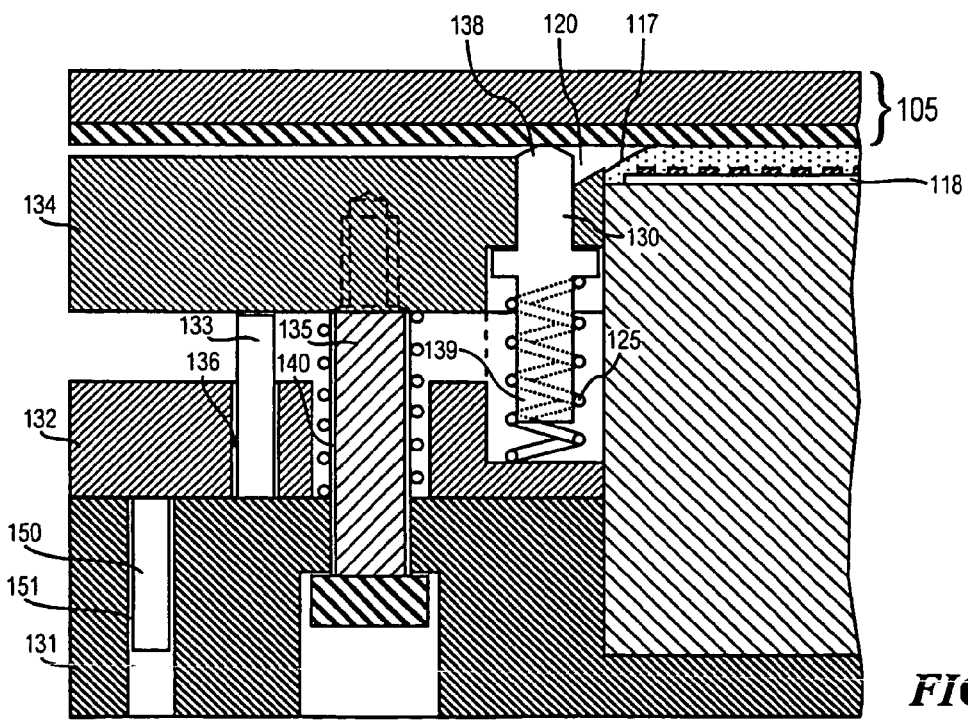
Figure 4C:
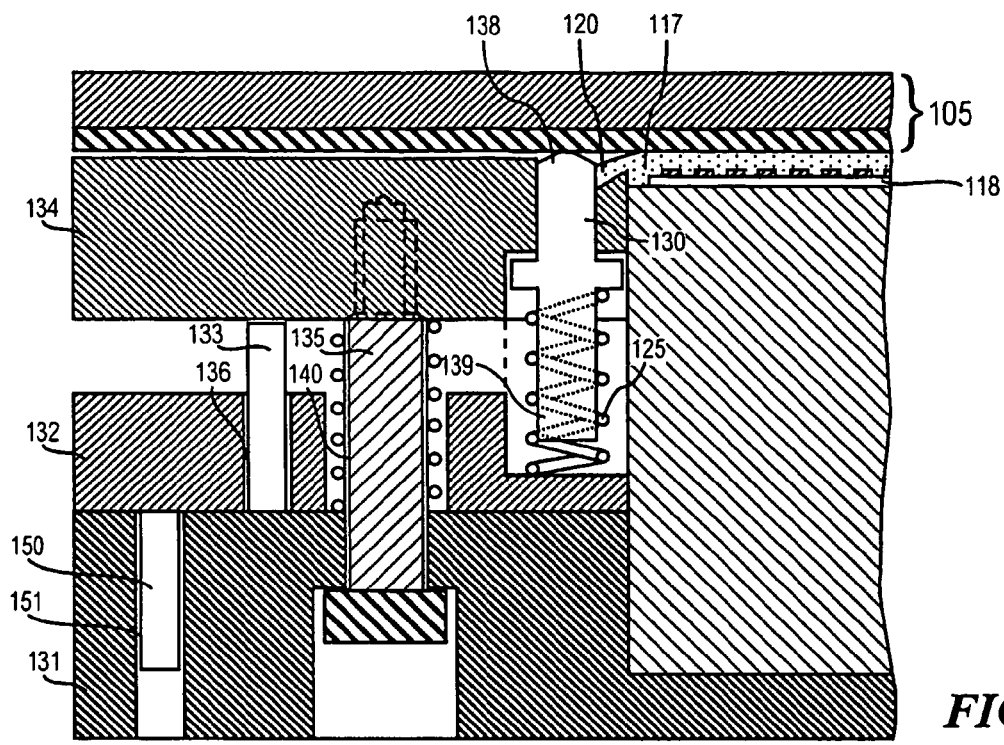

As is known, the upper and lower mold pieces 105 and 110 are heated to a predetermined temperature, typically 160-175 degrees Celsius (° C.), and the mold pieces 105 and 110 are then moved 325 to the molding position. During this movement, the heat from the heated mold pieces 105 and 110 and the compressive forces between the mold pieces 105 and 110 on the pellet 405, causes the pellet 405 to change to a more liquid state. In this state, the mold compound flows across the interconnect surface of the semiconductor wafer 118 as shown in FIG. 4B, between the interconnects 119. Note here that the upper portion 138 of the plunger 130 now abuts the cavity bar 115 and the plunger 130 is pushed downwards against the force of the spring 125. As the two mold pieces 105 and 110 continue moving towards each other, the molten mold compound is forced out from the primary cavity 117 and channeled 327 through the gate 121 into the secondary cavities 120, as shown in FIG. 4C.

Figure 4D:
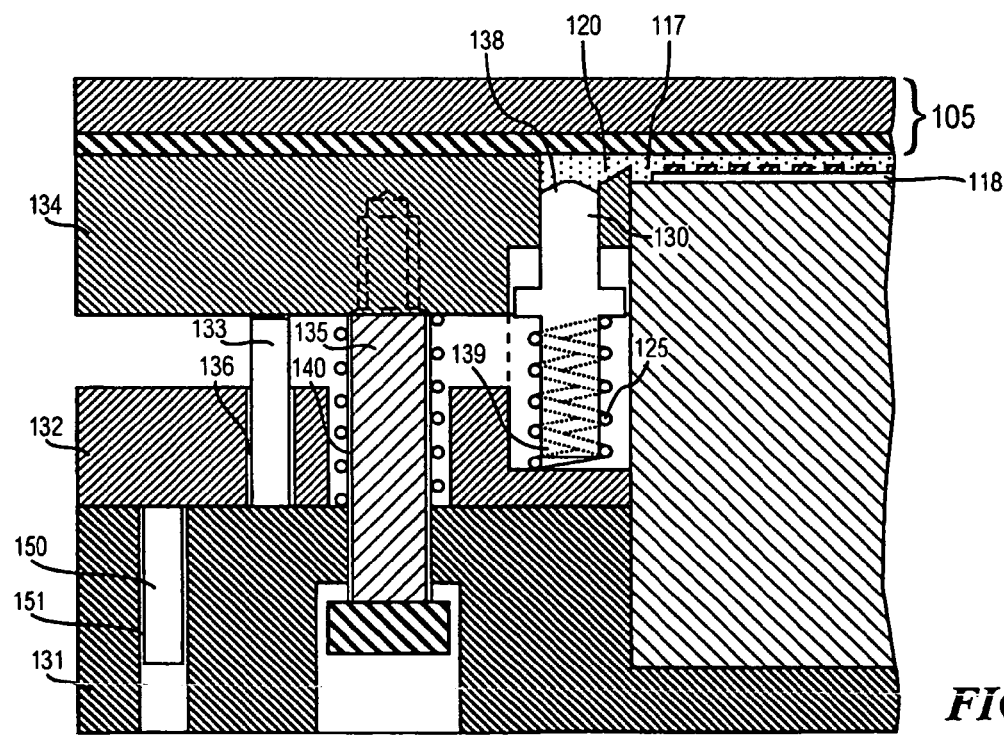

When the upper and lower mold pieces 105 and 110 abut, the pressure on the compressed mold compound in the primary cavity 117 and the secondary cavities 120 act against the upper portion 138 of the plunger 130. When the pressure on the plunger 130 is greater than the force of the spring 125, the plunger 130 is displaced downwards against the force of the spring 125. As the force of the spring 125 is preset to impose a predetermined pressure on the mold compound, the mold compound in the secondary cavities 120 and the primary cavity 117 has the predetermined pressure applied 329, as shown in FIG. 4D.

Figure 4E:
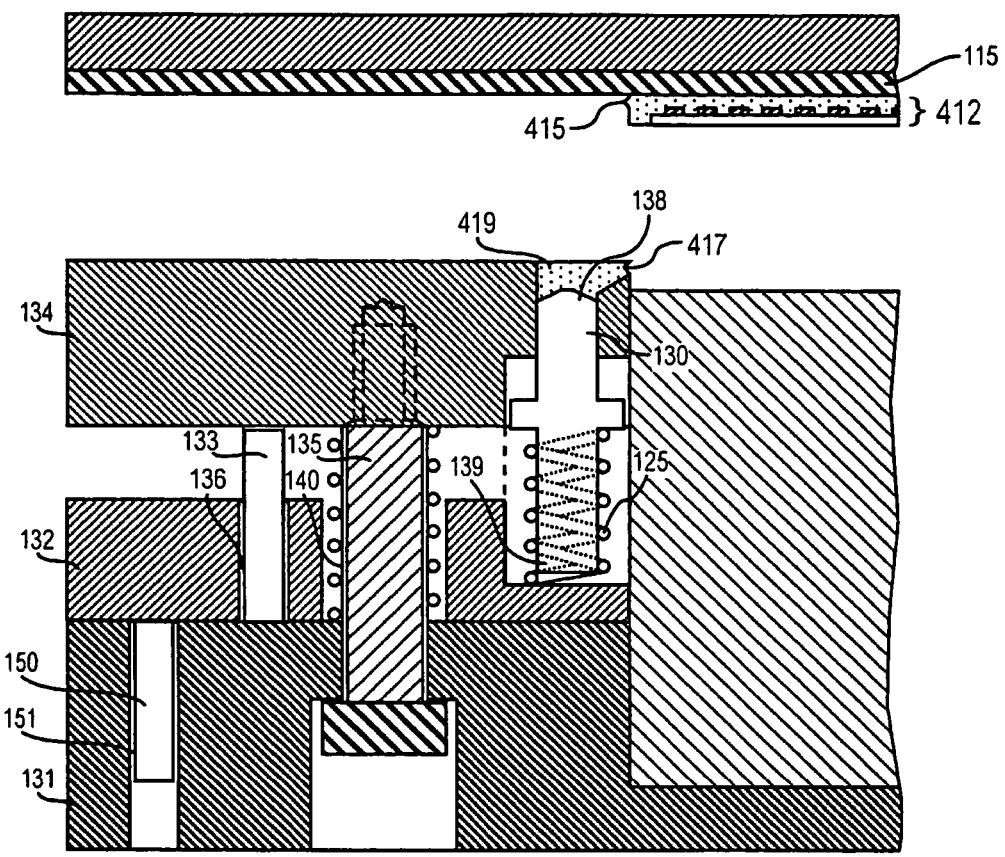

The mold compound is then allowed to set 330 for a period of time, after which the mold pieces 105 and 110 are moved 335 to the open position. With reference to FIG. 4E, as the mold pieces 105 and 110 move apart to the open position, the binding force between the mold compound portion of the molded semiconductor wafer 412 and the cavity bar 115, is as great as the binding force between the portion of mold compound that is solidified 419 in the secondary cavities 120 and the surface of the secondary cavities 120, and the surface of the upper portion 138 of the plunger 130. This is ensured by the shape of the upper portion 138 of the plunger 130, and by ensuring that the upper portion 138 of the plunger 130 is displaced downwards below the surface of the gate 121, as shown in FIG. 4D. In particular, the vertical surfaces provided by the sides of the opening in the lower cavity plate 134 in which the plunger 130 moves, and the secondary cavities 120 as a whole, contribute substantially to the binding force with the mold compound.

As a result, the molded semiconductor wafer 412 (as shown in FIG. 4E) adheres to the cavity bar 115, and the portion of solidified mold compound 419 in the secondary cavities 120 adhere to the surface of the secondary cavity. By design, the solidified mold compound at the gate 121 forms a weak link, consequently this link breaks as the mold pieces 105 and 110 move apart to the open position. Portions of the broken link are identifiable on a side surface 415 of the molded semiconductor wafer 412, and on the side surface 417 of the portion of solidified mold compound 419.

Figure 4F:
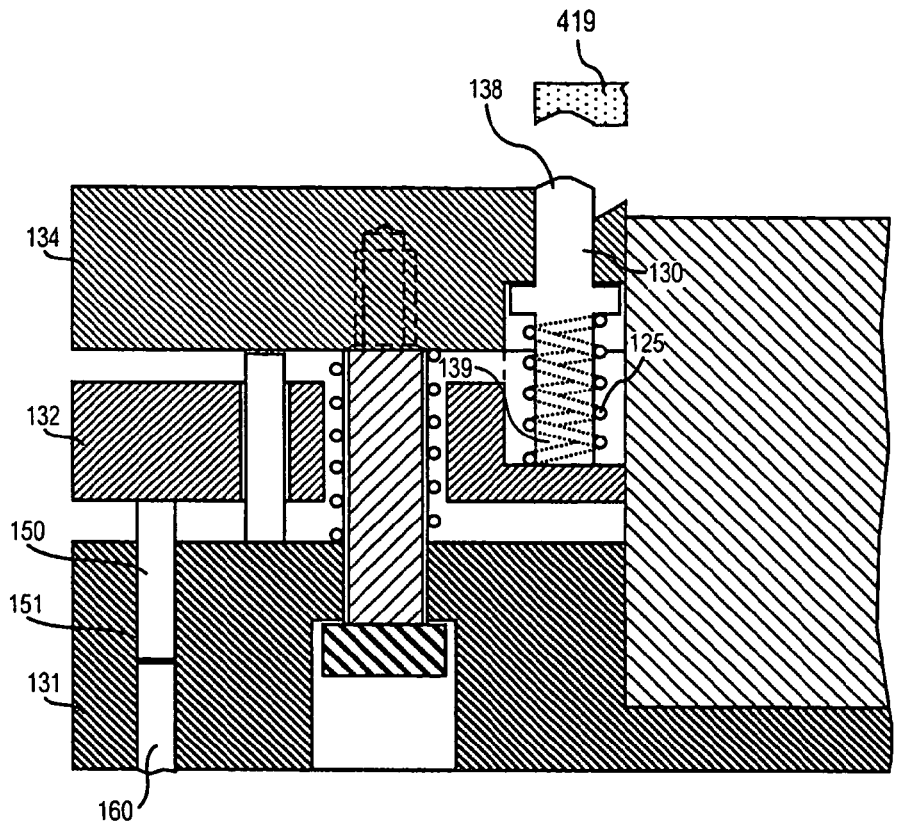
Figure 4G:
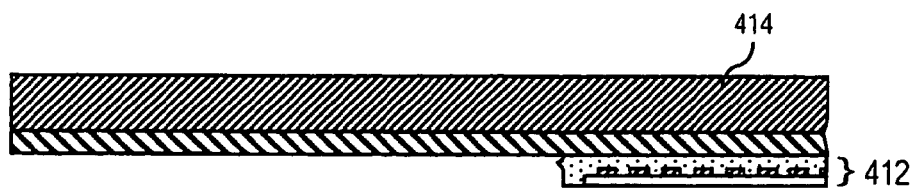

With the mold pieces 105 ad 110 in the open position, the actuator 160 in the lower portion of the press, moves upward through the opening 151 and abuts the free end of the ejector shaft 150, forcing the ejector shaft 150 upward. This causes the ejector plate 132 to move upward against its own weight and he force of the spring 125, and the extended portion 152 of the ejector plate 132 abuts the lower portion 139 of the plunger 130 and lifts the plunger 130 upwards. Consequently, the upper portion 138 of the plunger 130 moves upwards and forces or ejects the portion of solidified mold compound 419 from the secondary cavities 120, as shown in FIG. 4F. The ejector plate 132 then returns to the position shown in FIG. 4E when the actuator 160 in the lower portion of the press is deactivated.

With the molded semiconductor wafer 412 adhering to the cavity bar 115, the cavity bar is removed 340 from the upper mold piece 105, and the temperature of the cavity bar 115 is reduced 345 relative to the temperature of the molded semiconductor wafer 412. This can be accomplished in a number of ways. For example, the cavity bar 115 can be placed in contact with a cooler metal piece 414, as shown in FIG. 4F. The metal bar 414 then acts as a heat sink, thus cooling the cavity bar 115. Alternatively, coolant in the form of air jets may be directed at the cavity bar (not shown). It will be appreciated that in order to facilitate cooling of the cavity bar 115, the cavity bar 115 can be made with a relatively small volume of metal, thus reducing the residual heat in the cavity bar 115, that is to be taken away. While cooling down, the molding compound of the molded semiconductor wafer 412 shrinks. The shrinkage of the molded wafer 412 is much more than contraction of the cavity bar 115 during cool down, which reduces the binding between the molded semiconductor wafer 412 and the cavity bar 115, resulting in the molded semiconductor wafer 412 detaching from the cavity bar.

Of course, a vacuum mechanism may be employed to hold the molded semiconductor wafer 412. The molded semiconductor wafer 412 is received 350 as it comes off the cavity bar 115, and the relatively thin layer of excess mold compound on the molded semiconductor wafer 412 is then removed 355, as is known to one skilled in the art, until the free ends of the interconnects 119 are exposed. A variety of processes may be employed in addition to or instead of a grinding process. These include laser etching and lapping. The molding process 300 then ends 360.

Figure 5:
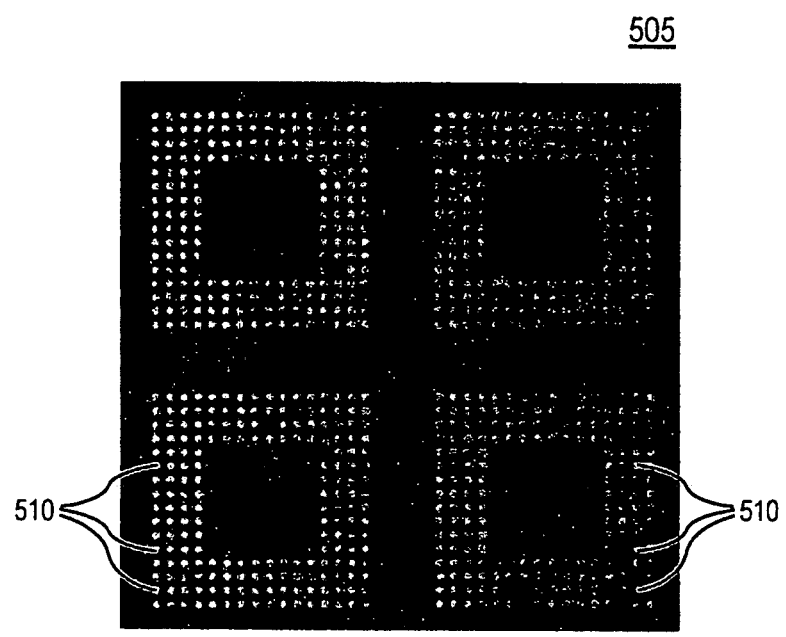
FIG. 5 shows a photograph a portion of a molded semiconductor wafer molded with the process in FIG. 3 as viewed from the molded interconnect side.

FIG. 5 shows a portion of a molded semiconductor wafer 505 as viewed from the interconnect side of the semiconductor wafer after molding, but before removing the thin layer of excess mold compound. Note that the interconnects 510 are visible through the layer of excess mold compound which is approximately 20-30 microns ($10^{-6}$ meters) thick, as measured from the free ends of the interconnects and the surface of the molded compound.

The present invention, as described, provides a method for molding a layer of mold compound on the interconnect side of a bumped semiconductor wafer, where the layer of mold compound is relatively thin and more efficiently removed than the layer of mold compound formed using the prior art processes. In addition, the molding does not require the use of film.

This is accomplished using mold pieces that have secondary or overflow chambers into which most of the excess mold compound flows from a mold cavity. A predetermined back pressure in the overflow chambers ensures that the pressure in the mold cavity is a desired mold compound pressure. In this way, the formation of voids in the mold compound in the mold cavity is substantially reduced, and a relatively thin layer of mold compound is formed over the free ends of the interconnects, advantageously allowing the layer of mold compound to be efficiently removed.

In addition, one of the mold pieces includes a cavity bar to which the molded semiconductor wafer adheres after molding. The cavity bar is then removed from the mold piece and cooled. While cooling down, the molding compound of the molded semiconductor wafer shrinks. The shrinkage of the molded wafer is much more than contraction of the cavity bar during cool down, which reduces the binding between the molded semiconductor wafer and the cavity bar, resulting in the molded semiconductor wafer detaching from the cavity bar. Hence, the molded semiconductor wafer is advantageously removed from the mold piece without the expense of film, and without subjecting the molded semiconductor wafer to the risk of damage by mechanical removal.

The present invention therefore provides an apparatus for wafer molding and process therefor which overcomes, or at least reduces, the abovementioned problems of the prior art.

It will be appreciated that although only one particular embodiment of the invention has been described in detail, various modifications and improvements can be made by a person skilled in the art without departing from the scope of the present invention.

The invention claimed is:

1. An apparatus comprising:
    means for moving a plurality of mold pieces to an open position to allow a substrate to be disposed on at least one of the plurality of mold pieces;
    means for disposing a predetermined amount of mold compound on the at least one surface of the substrate; and
    means for moving the plurality of mold pieces from the open position to a molding position to form a primary cavity, a secondary cavity and channel therebetween, with the substrate and the predetermined amount of mold compound in the primary cavity.

2. The apparatus of claim 1 comprising means for compressing the predetermined amount of mold compound and the substrate in the primary cavity.

3. The apparatus of claim 2 comprising means for channeling excess mold compound from the primary cavity to the secondary cavity via the channel.

4. The apparatus of claim 3 comprising means for asserting a predetermined pressure on the excess mold compound in the secondary cavity.

5. The apparatus of claim 4 comprising means for allowing the mold compound to set under the imposed predetermined pressure.

6. The apparatus of claim 5 comprising means for moving the plurality of mold pieces from the molding position to the open position.

7. The apparatus of claim 6 comprising means for removing the molded substrate from the primary cavity.

8. The apparatus of claim 7 comprising means for removing the layer of mold compound on the substrate such that free ends of the interconnects are exposed.

9. The apparatus of claim 1 wherein the means for moving the plurality of mold pieces to the open position comprises a press.

10. The apparatus of claim 1 wherein the means for disposing a predetermined amount of mold compound on the at least one surface of the substrate comprises a pellet of mold compound.

11. The apparatus of claim 1 wherein the means for moving the plurality of mold pieces from the open position to the molding position to form the primary cavity, the secondary cavity and the channel therebetween, with the substrate and the predetermined amount of mold compound in the primary cavity comprises:
    a press;
    a first mold piece coupled to the press, the first mold piece having the primary cavity for holding the substrate and the predetermined amount of mold compound on at least one surface of the substrate, the primary cavity configured for heating to melt the mold compound and form a layer of mold compound on the at least one surface of the substrate;
    a second mold piece coupled to the press, the second mold piece forming the secondary cavity coupled to the primary cavity, the secondary cavity configured for receiving excess mold compound from the primary cavity, and the secondary cavity having a third mold piece firming a movable portion for asserting a predetermined pressure on the mold compound while moving to receive the excess mold compound.

12. The apparatus of claim 11 wherein a predetermined pressure applied by a plunger acts against a pressure exerted upon the predetermined amount of mold compound disposed within the primary cavity.

13. The apparatus of claim 1 wherein a first mold piece comprises a substantially planar molding surface.

14. The apparatus of claim 1 wherein a first mold piece comprises a substantially planar molding surface, the first mold piece for abutting a second mold piece to form the primary cavity, the secondary cavity and the channel.

15. The apparatus of claim 14 wherein the first mold piece comprises a movable mold portion, and wherein the substantially planar molding surface is on the movable mold portion, the movable mold portion being movably mounted for moving between a first position for molding and a second position after molding, where at the second position the movable mold portion is moved away from the rest of the first mold piece.

16. The apparatus of claim 1 further comprising a moveable portion.

17. The apparatus of claim 16 wherein the movable portion comprises a plunger.

18. The apparatus of claim 17 wherein a predetermined pressure applied by the plunger acts against a pressure exerted upon the predetermined amount of mold compound disposed within the primary cavity.

19. The apparatus of claim 18 wherein the plunger is configured to apply a backpressure on the predetermined amount of mold compound.

20. The apparatus of claim 1 wherein a predetermined pressure applied by a plunger acts against a pressure exerted upon the predetermined amount of mold compound disposed within the primary cavity.

21. The apparatus of claim 20 further comprising a movable portion coupled to a biasing element to assert a corresponding force on the movable portion.

22. The apparatus of claim 21 wherein the movable portion comprises a plunger, and wherein the biasing element comprises a spring.

23. The apparatus of claim 22 wherein the movable mold portion comprises a first material having a higher coefficient of thermal expansion than the material of the substrate.

24. The apparatus of claim 21 wherein the movable portion comprises a plunger, and wherein the biasing element comprises a pneumatic actuator.

25. The apparatus of claim 21 wherein the movable portion comprises a plunger, and wherein the biasing element comprises a hydraulic actuator.

26. The apparatus of claim 21 wherein the movable portion comprises a plunger, and wherein the biasing element comprises an actuator.

* * * * *